United States Patent [19]

Axelrod

[11] Patent Number: 5,110,156

[45] Date of Patent: May 5, 1992

[54] LITHOGRAPHIC PRINT AND METHOD

[76] Inventor: Herbert R. Axelrod, 6 Marine Pl., Deal, N.J. 07753

[21] Appl. No.: 483,918

[22] Filed: Feb. 23, 1990

[51] Int. Cl.[5] .................. B42D 15/00; B41M 1/14
[52] U.S. Cl. ........................... 283/117; 101/211; 101/450.1
[58] Field of Search .................. 101/211, 450.1; 283/117

[56] References Cited

U.S. PATENT DOCUMENTS 4,149,464  4/1979  Rapoport et al. ............ 101/211 X
4,179,990  12/1979  Radencic .................... 101/211 X
4,217,822  8/1980  Milligan .................... 101/211

Primary Examiner—Timothy V. Eley
Assistant Examiner—Willman Fridie, Jr.

[57] ABSTRACT

A lithographic print of a color photograph which includes printed lettering in an area where the density of the ink dots which reproduce the photograph is reduced to enhance the visibility of the printed lettering.

The print is prepared by superimposing a screen having a substantially lower dot density over the portions of the color separation films corresponding to the area reserved for lettering and preparing the engraved printing plates from these screened films.

2 Claims, 2 Drawing Sheets

LITHOGRAPHIC PRINT AND METHOD

This invention relates to a lithographic print of a color photograph with printed lettering of enhanced visibility.

In another aspect the invention concerns a lithographic reproduction method for preparing such prints.

When color photographs are lithographically reproduced as book covers or pages of advertising brochures and the like, it is usually required that such covers or pages also bear conventional printed indicia. In the case of book covers, such indicia will normally include the title of the book, the author and may include other information concerning the contents of the book. Pages of advertising brochures will typically include printed information concerning a product, its supplier, etc. Even if the color hues and intensities of the photograph vary widely from the hue and intensity of the ink used for the printed lettering the visibility of the lettering, is somewhat reduced and the resultant lithographic reproduction of the photograph with the superimposed printed indicia may frequently give a "busy" visual impression.

In the past the color separation films used to prepare engraved lithographic printing plates or the original photograph itself were edited by airbrushing in the areas reserved for printed lettering, to provide a contrasting background for the printing. However, this technique is time consuming and often still failed to overcome the "busy" visual impression of the finished product.

Accordingly, it would be desirable to provide a lithographic reproduction of a color photograph with superimposed printed indicia, in which the visibility of the indicia is enhanced. It would also be desirable to provide such print by a convenient technique which can be readily and inexpensively performed by persons of ordinary skill in lithography.

The principal object of the present invention is to provide such an improved lithographic reproduction of a color photograph with conventional printing and enhanced visibility.

Another object of the invention is to provide a method for preparing such prints which is less expensive and time consuming than the prior art airbrush techniques, in which the materials and general techniques which are used are commonly available to lithographers.

These and other, further and more specific objects and advantages of the invention will be apparent to those skilled in the art from the following detailed description thereof, taken in conjunction with the drawings in which.

Briefly, in accordance with one embodiment of the invention I provide a lithographic print of a color photograph in which the photograph is lithographically simulated in a first area in its normal color hues and intensities. In a second area of the print the density of the lithographically printed ink dots is reduced. The second area contains printed lettering. In the first area the photograph is optically simulated by a pattern of printed dots of primary colors. The proportion of dots of each primary color varies across to the surface of the first area, to reproduce variations in the color hues of the photograph. The density of the dots also varies across the surface of the first area to reproduce variations in the color intensity of the photograph. In the second area of the print the proportion of dots used to reproduce variations in hues is substantially the same as would appear if the photograph is normally lithographically reproduced, but the density of such dots is substantially reduced in the second area. Printed lettering in the second area thus appears on a field of reduced color intensity, but with the appropriate variation in color hues, as may be found in other areas of the print. The printed lettering has enhanced visibility and the "busy" effect is substantially reduced or eliminated.

In accordance with another embodiment of the invention an improved lithographic method for reproduction of color photographs with superimposed printed lettering is provided. Essentially, the method of the invention utilizes the basic steps of conventional color lithography which includes preparing color separation films of a photograph, superimposing lithographic screens on these films, preparing engraved lithographic printing plates from the screened films and reproducing the photograph by sequentially printing colored inks on a substrate with the engraved printing plates. According to my method, the visibility of printed lettering superimposed on the photograph reproduced is improved by superimposing over a preselected area of at least one of the screened color separation films a screen having a substantially reduced dot density than the screen over the remainder of the film, preparing an engraved printing plate from the thus screened film, printing the reproduction using this plate to reproduce the photograph with reduced color intensity in the preselected area and printing the lettering in the preselected area of reduced color intensity.

As used herein, and in the appended claims the term "lettering" means any indica such as letters, numbers, symbols, lines, etc. which are printed on the area of reduced color intensity and which do not appear in the original photograph.

Figure 1:
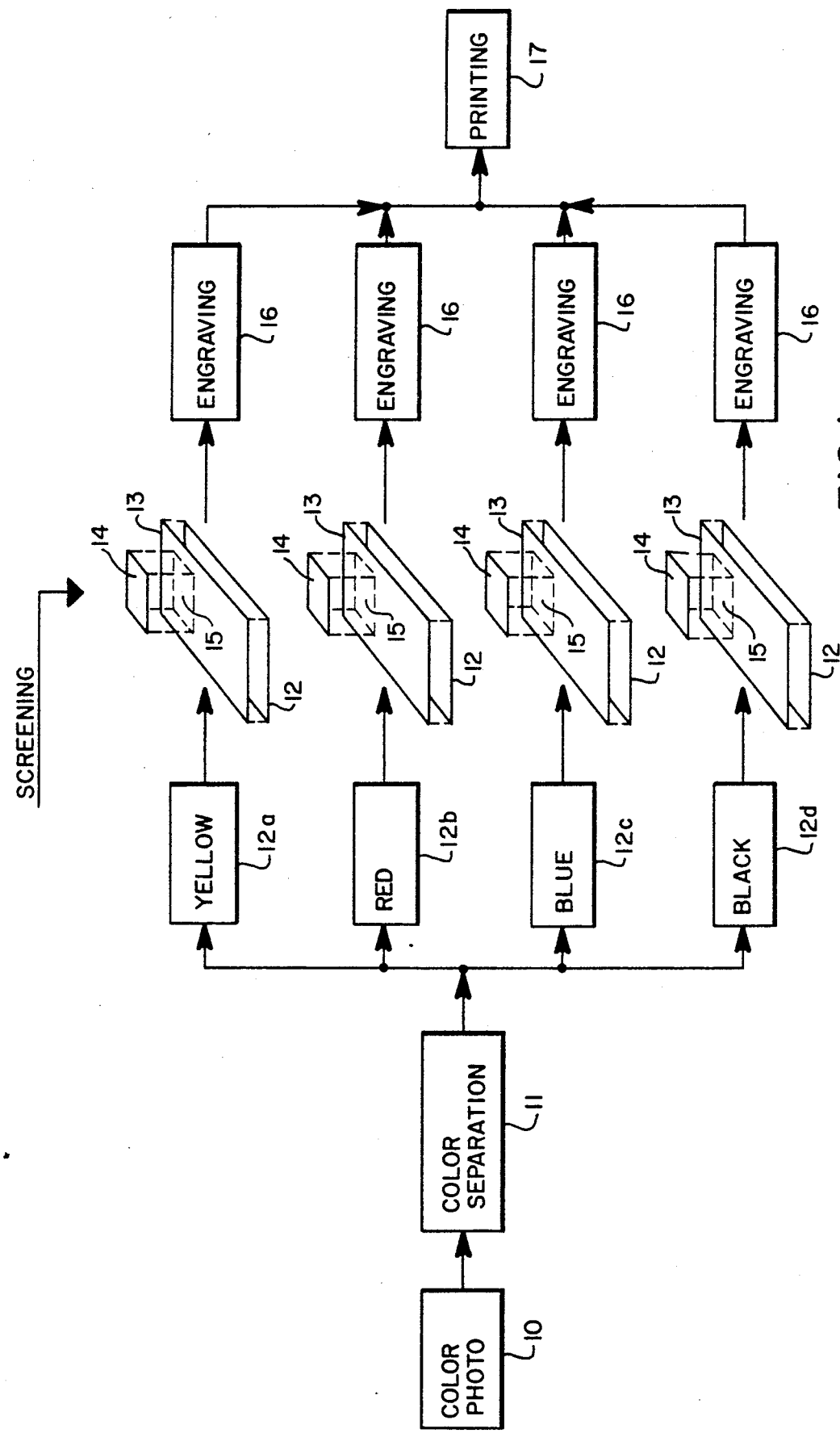
FIG. 1 is a diagram illustrating the steps of the method of the invention.

Turning now to the drawings, FIG. 1 depicts a conventional lithographic method for print reproductions of color photographs, modified in accordance with the principles of the invention. The color photograph 10 is subjected to conventional color separation techniques to produce separate color separation films 12a, 12b, 12c and 12d. Each of the separation films 12 is screened by superimposing a conventional lithographic screen 13. A second similar screen 14 is superimposed on a preselected area 15 of the conventional screen 13 and the resulting composite 12-13-14 is then used in the conventional lithographic engraving step 16 to prepare printing plates which are used in the conventional lithographic printing process 17 to produce the final product, for example as illustrated in FIG. 2.

Figure 2:
FIG. 2 depicts a typical book cover which embodies the present invention.

FIG. 2 depicts a book cover, generally indicated by reference numeral 21. The first major area 22 of the lithographed print reproduces the color intensities and hues of an underwater photograph of a fish 23 and background vegetation 24. The second area 25 of the cover 21, preselected for printed lettering 26, also reproduces the variation in hues of the water 27 and vegetation 24. However, the intensity of such hues is substantially reduced in the second area 25, to provide a background which renders the printing much more visible while retaining the aesthetic effect of a "photographic" background for the printing.

Figure 3:
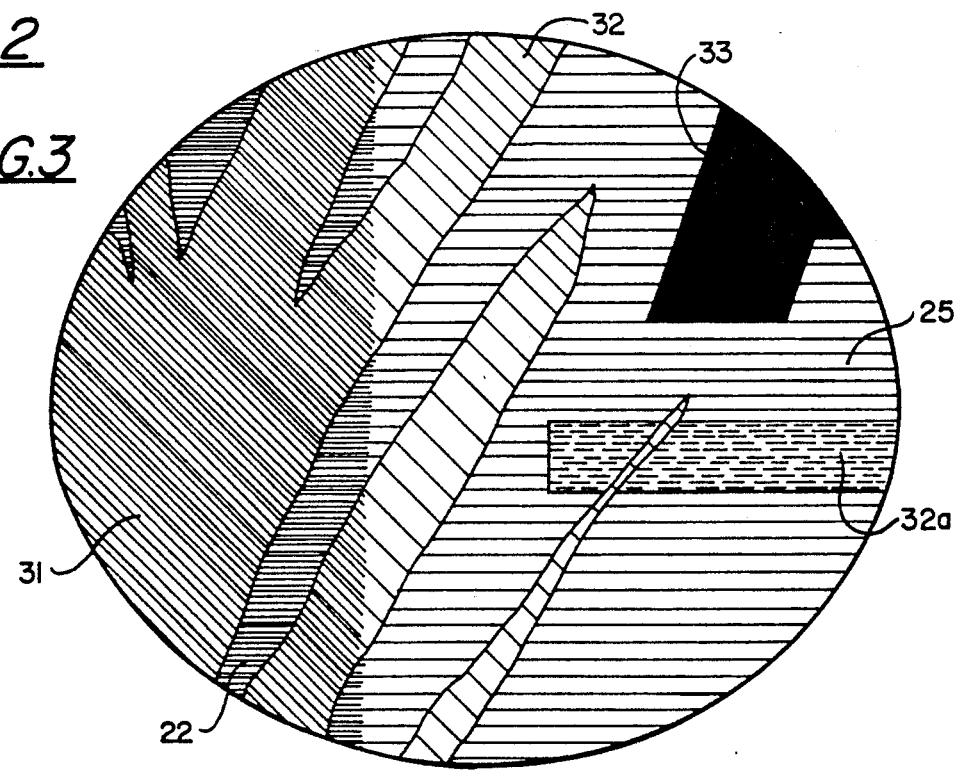
FIG. 3 is an enlarged view of area A of FIG. 2.

As will be observed in FIG. 3, which is an enlargement of the area (A) of FIG. 2, the photographic background effect is obtained by maintaining the same proportions of primary color dots in the main areas of the cover 21 as in the second area selected for printing 32. However, as will be observed, the dot density in the areas 32 is substantially reduced to reduce the color intensity in the second area 21. The printed bar 32*a* appears in half tone while the printed letter 33 is solid.

According to the presently preferred embodiment of the invention, the dot density in the second preselected area reserved for printed lettering is about 30% of the dot density in the first area which constitutes the remainder of the photographic reproduction. However, the exact reduction in dot density is not highly critical and can be varied over a wide range, depending upon the effect desired. For example, the dot density can vary from by 10 to about 70% of the normal density with corresponding changes in overall visual effect.

Having described my invention in such terms as to enable those skilled in lithography to understand and practice it, and having identified the presently preferred embodiments thereof, I claim;

1. A lithographic print of a color photograph including:
   (a) a first area of said print in which the color of said photograph are optically simulated by a pattern of printed dots of primary colors to accurately reproduce the hues and color intensity in said first area of said photograph,
      (i) the proportion of dots of each primary color varying across the surface of said first area to reproduce variations in the color hues of said first area of said photograph, and
      (ii) the density of dots of each color varying across the surface of said first area to reproduce variations in the color intensity of said first area of the said photograph;
   (b) a second area of said print, in which the density of said dots is reduced to accurately reproduce the hues of said photographs but to reduce the color intensity thereof; and
   (c) printed lettering in said second area.

2. In the lithographic reproduction of color photographs, including the steps of
   preparing color separation films from said photograph,
   superimposing lithographic screens on said films,
   preparing engraved printing plates from said screened films, and
   preparing said reproduction by sequentially printing colored inks on a substrate with said engraved plates,
the method, whereby the visibility of printed lettering on said reproduction is improved, comprising:
   (a) superimposing over a preselected area of at least one of said screened films, a screen having a substantially reduced dot density than the remainder of said lithographic screen;
   (b) preparing an engraved printing plate from the screened film of paragraph (a);
   (c) printing said reproduction, using the engraved plate of step (b), to reproduce said photograph with reduced color intensity only in said preselected area;
   (d) printing said lettering in said preselected area of reduced color intensity.

* * * * *